United States Patent [19]
Ho

[11] Patent Number: 6,088,293
[45] Date of Patent: Jul. 11, 2000

[54] LOW-POWER COLUMN DECODE CIRCUIT

[75] Inventor: Michael Duc Ho, Houston, Tex.

[73] Assignee: Texas Instruments Incorporated, Dallas, Tex.

[21] Appl. No.: 09/390,568

[22] Filed: Sep. 3, 1999

[51] Int. Cl.[7] ................................................ G11C 8/00
[52] U.S. Cl. .............. 365/233; 365/230.03; 365/230.06; 365/230.01; 365/230.08
[58] Field of Search .............. 365/230.01, 230.03, 365/230.06, 230.08, 233

[56] References Cited

U.S. PATENT DOCUMENTS

| | | | |
|---|---|---|---|
| 5,671,392 | 9/1997 | Parris et al. | 395/475 |
| 5,703,828 | 12/1997 | Park et al. | 365/230.03 |
| 5,717,651 | 2/1998 | Kikukawa et al. | 365/233 |
| 5,742,554 | 4/1998 | Fujioka | 365/222 |
| 5,798,978 | 8/1998 | Yoo et al. | 365/230.06 |
| 5,856,952 | 1/1999 | Yoo et al. | 365/230.08 |
| 5,905,689 | 5/1999 | Oh | 365/230.06 |
| 5,970,016 | 10/1999 | Ohsawa | 365/230.03 |
| 5,996,043 | 11/1999 | Manning | 711/105 |
| 6,026,045 | 2/2000 | Son | 365/230.03 |

*Primary Examiner*—Viet Q. Nguyen
*Attorney, Agent, or Firm*—Robert N. Rountree; Robby T. Holland; Frederick J. Telecky, Jr.

[57] ABSTRACT

A memory circuit is designed with a memory array (113, 115, 117, 119) having a plurality of banks. Each bank is addressable in response to a bank address signal (102), and each bank arranged in rows and columns of memory cells. Each of plural data leads (122) corresponds to a bank. Each data lead is selectively connected to a column of memory cells by a respective select transistor. A first decode circuit (501) has at least one input and one output terminal. The output terminal (525) is coupled to a control gate of at least one of the select transistors. Each of a plurality of second decode circuits (231) corresponds to a respective bank. Each second decode circuit has a memory element (423, 425, 428)), a plurality of input terminals and at least one output terminal. One second decode circuit input terminal (227) is coupled to receive a first address signal. Another second decode circuit input terminal (229) is coupled to receive the bank address signal. The second decode circuit output terminal coupled to the input terminal of the first decode circuit. The second decode circuit is arranged to store the first address signal in the memory element in response to the bank address signal.

20 Claims, 4 Drawing Sheets

LOW-POWER COLUMN DECODE CIRCUIT

FIELD OF THE INVENTION

This invention relates to an integrated circuit and more particularly to an integrated circuit with a low-power column decode circuit.

BACKGROUND OF THE INVENTION

Present complementary metal oxide semiconductor (CMOS) synchronous dynamic random access memory (SDRAM) circuits are frequently used for main memory in a variety of applications including desk top and portable computer systems. Advances in system technology have greatly increased demand for high speed under various modes of operation of these SDRAM circuits. These same advances, however, also demand minimal power consumption for laptop computers and other battery powered applications. SDRAM circuits frequently produce data in 4-bit, 8-bit and full-page serial and interleaved burst modes at high system clock frequencies. At these high clock frequencies of extended duration, burst cycle current (ICC4) is a critical component of active power. Previous SDRAM designs have had significant ICC4 current due to propagation of column address signals throughout the SDRAM column decode path with each column address transition. This technique provided high-speed data access at the cost of multiple column decode path transitions and significant ICC4 power consumption for each burst cycle. For example, a local column factor circuit of the prior art (FIG. 6) was used to generate local column factor address signals CFnuv from global column factor signal CFuv and bank address signal BANKn, where n, u and v are integer variables. Each time a bank was unselected, however, all local column factor signals CFnuv were taken low. When the bank was reselected for a subsequent access, local column factor signals CFnuv were often returned to their previous logic state, resulting in needless transitions of local column factor signals. These column factor signals propagated through highly capacitive bus lines in the column decode portion of each array, thereby increasing burst cycle current ICC4.

SUMMARY OF THE INVENTION

These problems are resolved by a memory circuit for operating synchronously with a system clock signal. The memory array has plural banks addressable by a bank address signal and arranged in rows and columns of memory cells. Plural sense amplifiers are coupled to respective columns of memory cells by respective select transistors. Plural column decode circuits have plural input terminals and at least one output terminal coupled to a control gate of the select transistors. Plural first predecode circuits have plural input terminals and at least one output terminal coupled to receive a respective first address signal. Each of a plurality of groups of second predecode circuits corresponds to a respective bank, and each predecode circuit has a memory element. One second predecode circuit input terminal is coupled to a first predecode circuit output terminal. Another second predecode circuit input terminal is coupled to receive the bank address signal. The second predecode circuit output terminal coupled to an input terminal of one of the column decode circuits. The second predecode circuit is arranged to store a second address signal in the memory element in response to the bank address signal.

The present invention stores a column address signal in response to a bank address signal. No column address signal transitions occur in the memory array until the proper bank address is determined.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
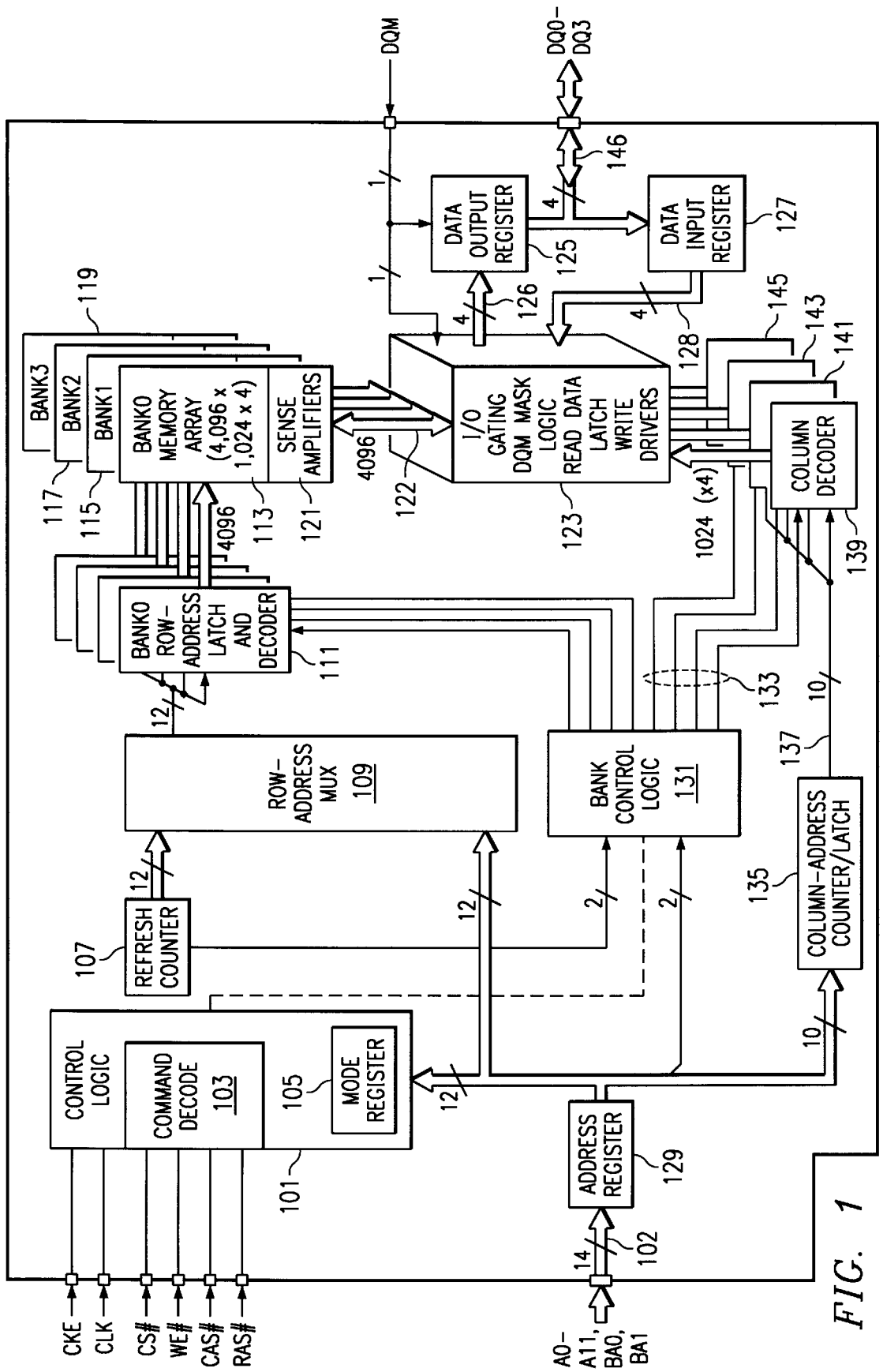
FIG. 1 is a block diagram of a 64 Megabit SDRAM which may employ the present invention.

Referring now to FIG. 1, a 64 Megabit SDRAM memory circuit which may employ the instant invention will be described in detail. The memory circuit includes control logic section 101 that receives external clock enable signal CKE, system clock signal CLK, chip select signal CS#, write enable signal WE#, column address strobe CAS# and row address strobe RAS#, where "#" indicates an active low signal as is well known in the art. The memory circuit further includes address register 129 for receiving external row and column addresses as determined by control signals RAS# and CAS# and producing internal address signals in synchronization with clock signal CLK. The memory circuit includes four banks 0–3 (113, 115, 117, 119) of memory cells. Each bank is separately addressable by bank addresses BA0 and BA1 at terminals 102. Each bank is arranged in 4096 rows and 1024 by 4 columns of memory cells. Each bank and row of memory cells is selectively activated, for example, by bank0 row address latch and decode circuit 111 and bank control logic 131 by row and bank address signals from address register 129. Each bank, for example bank0, includes sense amplifiers 121 coupled to respective columns of memory cells. The sense amplifiers are further coupled to column select transistors in the I/O gating section 123. These select transistors are selectively activated by local column decode circuits 139, 141, 143 and 145 corresponding to bank0-bank3 for read and write operations. The select transistors route data between the columns of memory cells and data terminals 146 via data leads 122, 126 and 128. Column decode circuits corresponding to the select transistors are selectively activated by column address signals from address register 129 that are latched or stored in the column address counter/latch circuit 135.

A memory read or write operation begins when one or more banks is activated in response to control signals and bank address signals. A selected row of memory cells within the bank is activated in response to the row address signals. Subsequently, a burst read or write command is issued to read data from or write data to columns of memory cells along an active row in an active bank. This burst read or write operation produces a sequence of data bits in synchronization with consecutive cycles of the system clock signal CLK. Sense amplifiers 121 amplify data on respective columns of memory cells along each active row in a read operation. Column select transistors route the amplified data to data leads of the data path. Data then flows to output register 125 and to output terminals 146.

Figure 2:
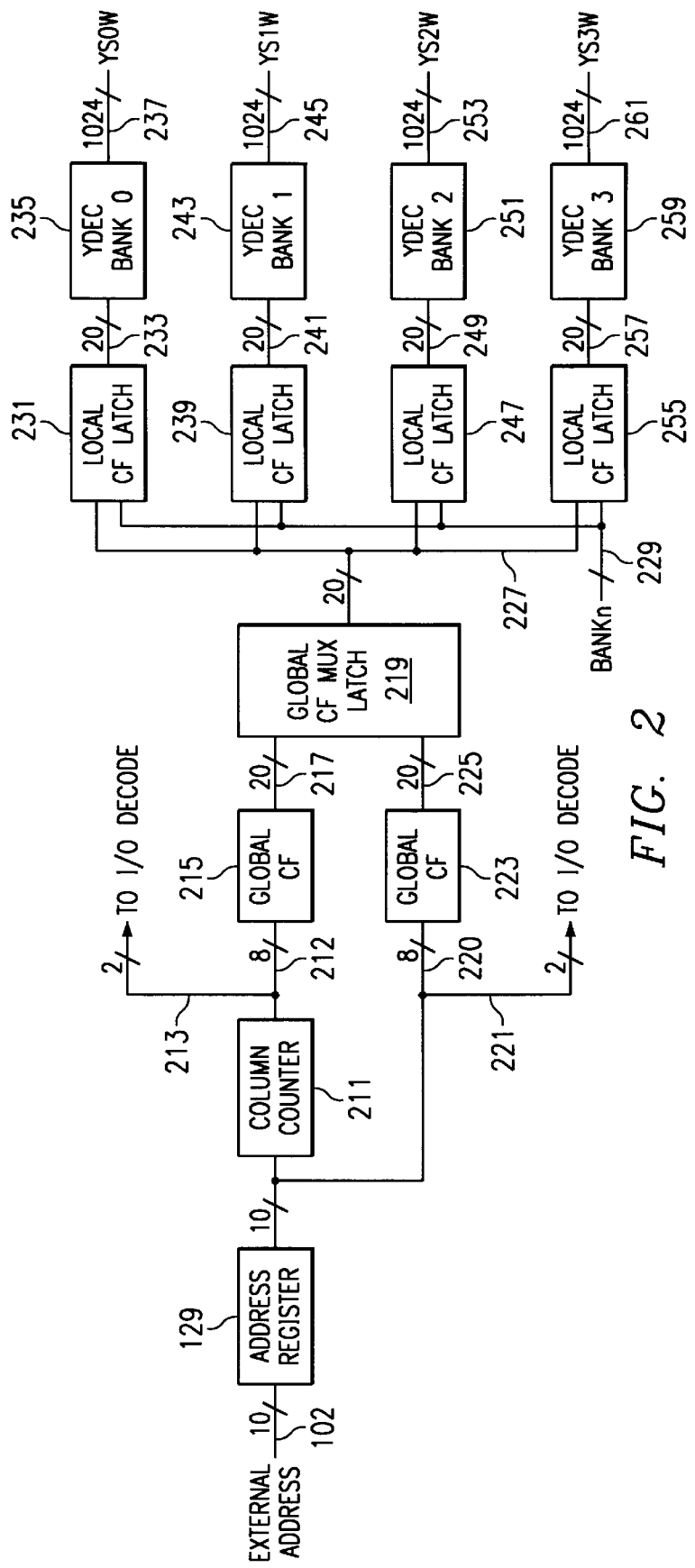
FIG. 2 is a block diagram of a column path for the 64 Megabit SDRAM of FIG. 1.

Turning now to FIG. 2, operation of the column path will be explained in detail. External column addresses are applied to address register 129 via address terminals 102 during a memory read or write operation. The address register 129 stores the column address signal and produces an internal column address signal in synchronization with the system clock signal CLK. This internal column address signal is applied to column counter 211 and to global column factor or predecode circuit 223. The global column factor or predecode circuit 223 receives an 8-bit address signal and produces a 20-bit address signal on bus 225 representing a first column address in a burst read or write sequence. This 20-bit address signal includes three sets of column factor signals as will be explained in detail. Column counter 211 loads and stores a second address in the burst sequence. Column counter 211 produces a 10-bit address signal corresponding to the second and subsequent column addresses of the burst sequence. Two address bits on buses 213 and 221 are routed to the I/O decode circuit for selecting 4 of 16 bits for final decoding. The 20-bit address signals or column factor signals are applied by global column factor or predecode circuits 215 and 223 to global column factor multiplex latch 219 via buses 217 and 225 respectively. The global column factor multiplex latch 219 selects the address on bus 225 for the first address of the burst sequence and second and subsequent addresses from bus 217. Each address is stored and routed via bus 227 to local column factor latches 231, 239, 247 and 255 corresponding to bank0-bank2, respectively. One of the local column factor circuits stores the global column factor signal in response to a respective bank address signal BANKn on bus 229. The selected local column factor latch, for example 231, produces a 20-bit address signal on bus 233 that selectively activates a column decode circuit 235 for bank0. This column decode circuit then activates a respective select transistor (not shown) which routes data between a selected sense amplifier and the data path.

Figure 3:
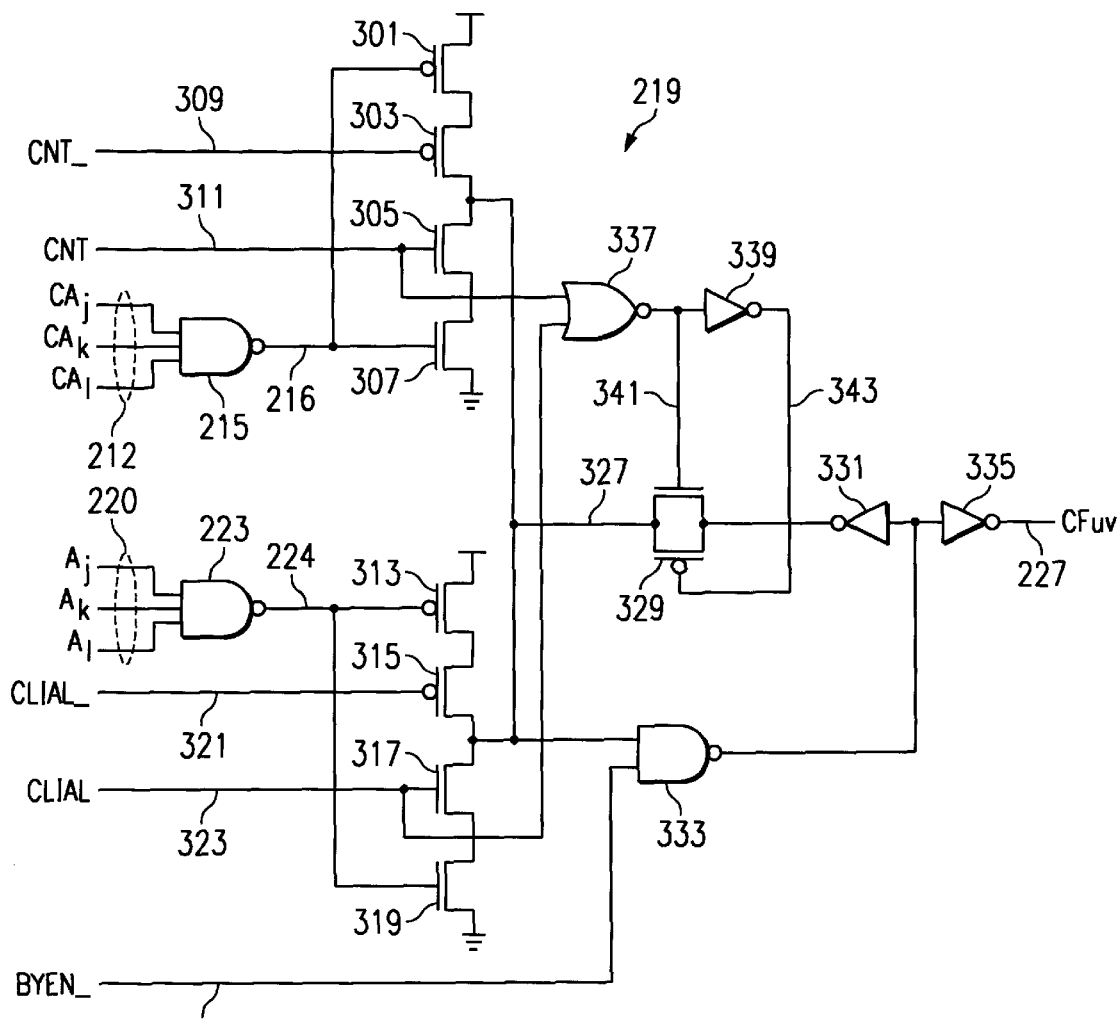
FIG. 3 is a schematic diagram of a global column factor, multiplex and latch circuit of FIG. 2.

A schematic diagram FIG. 3 of the global column factor or predecode circuits and the global column factor multiplex latch circuit 219 will be explained in detail with reference to Table I. The global column factor circuit 223 receives address bits Aj, Ak and Al on bus 220 and produces a logical NAND output signal on lead 224. This output signal on lead 224 is applied to a first tristate inverter formed by transistors 313, 315, 317 and 319. The tristate inverter is enabled by control signals CLIAL and CLIAL_ for loading the initial column address signal of a burst sequence of column addresses. This initial column address is stored as a logical AND of the address bits by a latch or memory element formed by NAND gate 333, inverter 331 and CMOS pass gate 329 and produced on bus 227 as global column factor signal CFuv. There are twenty of these global column factor circuits that produce the 20-bit address signal on bus 227 as shown by the enumerated values of each variable in Table I. A first set of global column factor circuits produces column factor signals CF00–CF07 for corresponding binary combinations of column address bits A0–A2. Likewise, a second set of global column factor circuits produces column factor signals CF30–CF37 for corresponding binary combinations of column address bits A3–A5. A final set of global column factor circuits produces column factor signals CF60–CF63 corresponding to binary combinations of column address bits A6–A7. This final set of column factor circuits is the same as FIG. 3 except that circuits 215 and 233 are 2-input NAND gates. Due to the unique state of each column address bit, only one column factor signal from each set is active at any time. This is highly advantageous for power conservation in the column path, since the other seventeen global column factor signals remain inactive. Thus, the substantial capacitive load represented by the inactive leads is not charged and discharged during addressing, thereby conserving power.

TABLE I

| CF0V | A012 | CF3V | A345 | CF6V | A67 |
|---|---|---|---|---|---|
| 0 | 000 | 0 | 000 | 0 | 00 |
| 1 | 100 | 1 | 100 | 1 | 10 |
| 2 | 010 | 2 | 010 | 2 | 01 |
| 3 | 110 | 3 | 110 | 3 | 11 |
| 4 | 001 | 4 | 001 | | |
| 5 | 101 | 5 | 101 | | |
| 6 | 011 | 6 | 011 | | |
| 7 | 111 | 7 | 111 | | |

Column address bits for the second and subsequent column addresses of a burst sequence are applied to global column factor circuit 215 from column address counter 211 via bus 212. A second tristate inverter formed by transistors 301, 303, 305 and 307 inverts the signal on lead 216 to porduce a logical AND of the column address counter bits on lead 327 in response to control signals CNT and CNT_. Control signal CNT also disables NOR gate 337, thereby turning off CMOS pass gate 329 to load a new address bit. These control signals are short-duration pulses in synchronization with system clock signal CLK for sequentially loading each new burst column address from the column address counter in the latch formed by NAND gate 333, inverter 331 and CMOS pass gate 329. Thus, appropriate global column factors CFuv for the second and subsequent column addresses in each burst are produced by global column factor circuit 215. Moreover, control logic is arranged so that no more than one of the two tristate inverters is on at any time.

Figure 4:
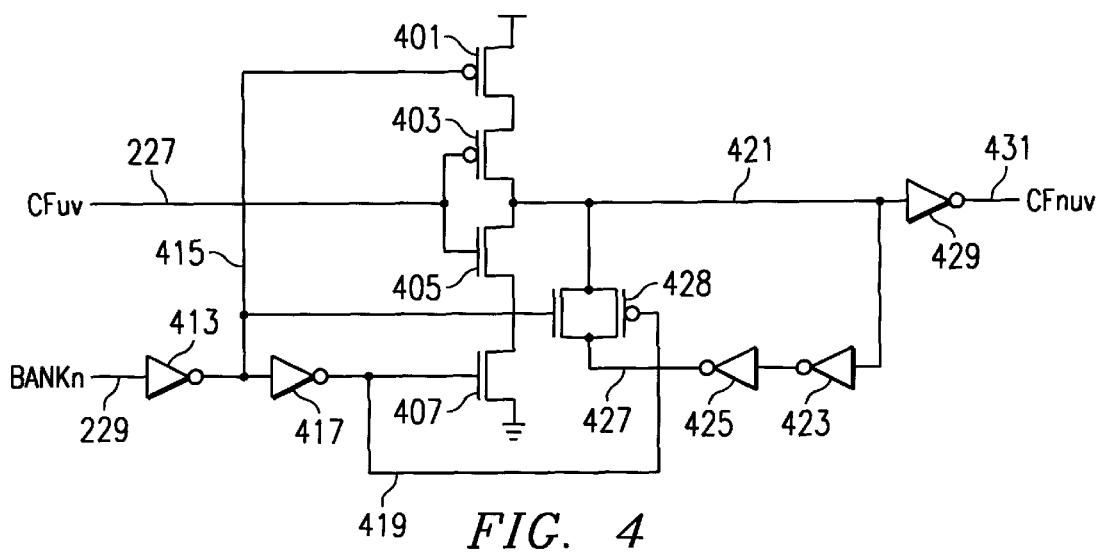
FIG. 4 is a schematic diagram of a local column factor and latch circuit of FIG. 2.

Turning now to FIG. 4, a schematic of a local column factor or predecode circuit of the instant invention will be explained in detail. The 20-bit global column factor signal is applied to each of twenty corresponding local column factor circuits in each bank via bus 227. The local column factor circuits, therefore, are local to each bank. Global column factor signal CFuv on bus 227 is applied to an input terminal of a tristate inverter formed by transistors 401, 403, 405 and 407. The tristate inverter is enabled by band signal BANKn, where "n" has an integral value 0–3 corresponding to a respective bank, thereby turning on transistors 401 and 407 when the bank is selected. Inverters 413 and 417 produce signals for turning off CMOS pass gate 428 when the tristate inverter is enabled. The tristate inverter, therefore, produces an inverted local column factor signal on lead 421 when the bank is active. Inverter 429 buffers the inverted local column factor signal and produces local column factor signal CFnuv on bus 431.

Bank select signal BANKn goes low when the bank is unselected. This low state disables the tristate inverter and enables CMOS pass gate 428, thereby storing the inverted local column factor signal on lead 421 in a memory element or latch formed by inverters 423 and 425 and CMOS pass gate 428. Thus, the local column factor signal remains unchanged while the bank is unselected. The bank select signal BANKn goes high when the bank is reselected for a subsequent burst read. If this subsequent burst read resumes at the previous address, most local column factor signals remain unchanged. This is highly advantageous, because typically only a single least significant local column factor signal may change state. Thus, power is conserved and burst cycle current ICC4 is greatly reduced.

Figure 5:
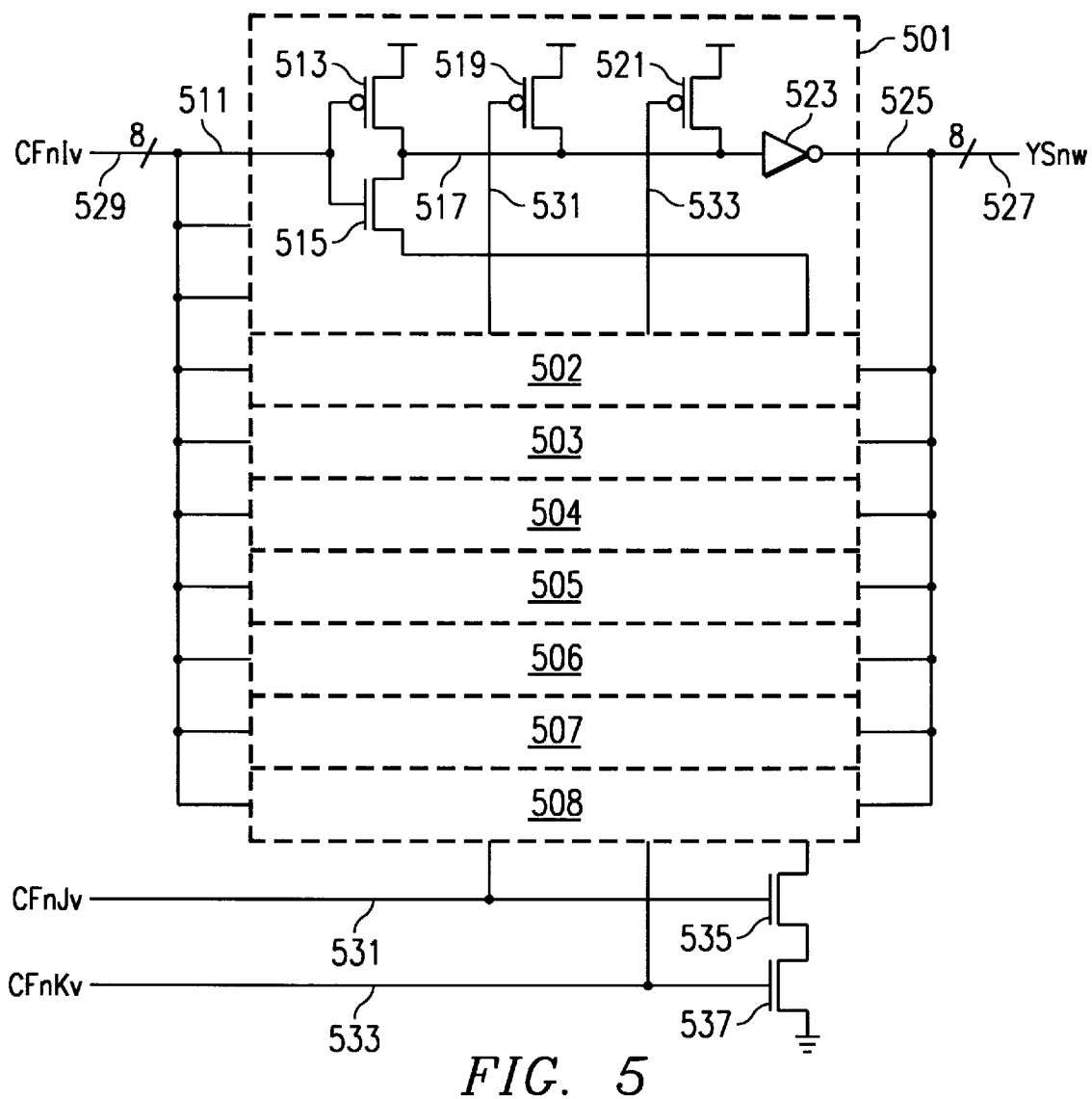
FIG. 5 is a schematic diagram of a column decode circuit of FIG. 2.
Figure 6:
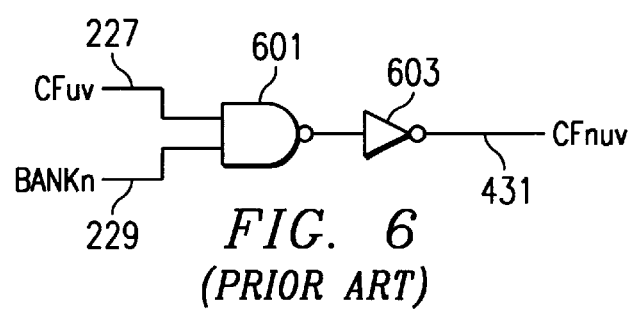
FIG. 6 is a local column factor circuit of the prior art.

The column decode circuit depicted in FIG. 5 includes eight sections 501–508, each of which includes a 3-input NAND gate and buffering inverter 523. The NAND gates are simplified by a common discharge path formed by transistors 535 and 537. The column decode circuit receives one local column factor signal from each of three sets on buses 529, 531 and 533. A selected column decode circuit, for example 501, is activated by a high level of each of local column factor signals CFnIv, CFnJv and CFnKv. These high levels turn off P-channel transistors 513, 519 and 521 and turn on N-channel transistors 515, 535 and 537. The N-channel transistors drive the signal on lead 517 low, thereby producing a high-level column select or Y-select signal YSnw on bus 527. This high level column select signal YSnw turns on a corresponding column select transistor as previously described, thereby coupling a selected sense amplifier and column of memory cells to a common data lead for read and write operations.

Although the invention has been described in detail with reference to a preferred embodiment, it is to be understood that this description is by way of example only and is not to be construed in a limiting sense. For example, the inventive concept of the instant invention would also apply to a column decode circuit that did not predecode column address bits to produce column factor signals. The circuit of FIG. 4 would then store a respective local address bit rather than a local column factor. Moreover, the memory circuit of FIG. 1 might be configured differently as, for example, a 4 Megabit by 16-bit word memory without compromise of the inventive concept. Finally, the inventive concept of the instant invention would also apply to a memory circuit combined with other logic on a single substrate or die. It is to be understood, therefore, that a system clock signal would apply to a clock signal for a system on a single die. It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A memory circuit for operating synchronously with a system clock signal, comprising:
   a memory array having a plurality of banks, each bank addressable in response to a bank address signal, each bank arranged in rows and columns of memory cells;
   a plurality of sense amplifiers, each sense amplifier coupled to a respective column of memory cells, each sense amplifier coupled to a data lead by a respective select transistor;
   a plurality of column decode circuits, each column decode circuit having a plurality of input terminals and at least one output terminal, the output terminal coupled to a control gate of at least one of the select transistors;
   a plurality of first predecode circuits, each first predecode circuit having a plurality of input terminals and at least one output terminal, each input terminal coupled to receive a respective first address signal; and
   a plurality of groups of second predecode circuits, each group corresponding to a respective bank, each second predecode circuit having a memory element, a plurality of input terminals and at least one output terminal, at least one second predecode circuit input terminal coupled to at least one first predecode circuit output terminal, at least another second predecode circuit input terminal coupled to receive the bank address signal, the second predecode circuit output terminal coupled to an input terminal of at least one of the column decode circuits, the second predecode circuit arranged to store a second address signal in the memory element in response to the bank address signal.

2. A memory circuit as in claim 1, further comprising an address register, the address register coupled to receive an external address signal, the address register producing the first address signal in synchronization with the system clock signal.

3. A memory circuit as in claim 1, further comprising an address counter, the address counter arranged for producing a counter address signal in synchronization with the system clock signal.

4. A memory circuit as in claim 3, further comprising a multiplex circuit, the multiplex circuit coupled to receive an external address signal and the counter address signal, the multiplex circuit selectively producing the first address signal in response to a control signal.

5. A memory circuit as in claim 1, wherein at least one of the first predecode circuits produces the second address signal at the first predecode circuit output terminal, the second address signal comprising a logical combination of at least two address bits.

6. A memory circuit as in claim 5, wherein the logical combination is a logical AND.

7. A memory circuit as in claim 5, wherein each first predecode circuit further comprises a memory circuit arranged to store the second address signal in synchronization with the system clock signal.

8. A memory circuit, comprising:
   a memory array having a plurality of banks, each bank addressable in response to a bank address signal, each bank arranged in rows and columns of memory cells;
   a plurality of data leads, each data lead corresponding to a bank, each data lead selectively connected to a column of memory cells by a respective select transistor;
   a column decode circuit having at least one input terminal and at least one output terminal, the output terminal coupled to a control gate of at least one select transistor;
   a first column factor circuit having a plurality of input terminals and at least one output terminal, each input terminal coupled to receive a respective first address signal; and
   a plurality of second column factor circuits, each column factor circuit corresponding to a respective bank, each column factor circuit having a memory element, a plurality of input terminals and at least one output terminal, at least one second column factor circuit input terminal coupled to at least one first column factor circuit output terminal, at least another second column factor circuit input terminal coupled to receive the bank address signal, the second column factor circuit output terminal coupled to an input terminal of at least one of the column decode circuits, the second column factor circuit arranged to store a second address signal in the memory element in response to the bank address signal.

9. A memory circuit as in claim 8, further comprising a control circuit coupled to receive a clock signal, the memory circuit arranged to operate in synchronization with the clock signal.

10. A memory circuit as in claim 9, further comprising an address register, the address register coupled to receive an external address signal, the address register producing the first address signal in synchronization with the clock signal.

11. A memory circuit as in claim 9, further comprising an address counter, the address counter arranged for producing a counter address signal in synchronization with the clock signal.

12. A memory circuit as in claim 11, further comprising a multiplex circuit, the multiplex circuit coupled to receive an external address signal and the counter address signal, the multiplex circuit selectively producing the first address signal in response to a control signal.

13. A memory circuit as in claim 12, wherein the first column factor circuit produces the second address signal at the first column factor circuit output terminal, the second address signal comprising a logical combination of at least two address bits.

14. A memory circuit as in claim 13, wherein the logical combination is a logical AND.

15. A memory circuit as in claim 13, wherein the first column factor circuit further comprises a memory element arranged to store the second address signal in synchronization with the system clock signal.

16. A memory circuit, comprising:
a memory array having a plurality of banks, each bank addressable in response to a bank address signal, each bank arranged in rows and columns of memory cells;
a plurality of data leads, each data lead corresponding to a bank, each data lead selectively connected to a column of memory cells by a respective select transistor;
a first decode circuit having at least one input and one output terminal, the output terminal coupled to a control gate of at least one of the select transistors;
a plurality of second decode circuits, each second decode circuit corresponding to a respective bank, each second decode circuit having a memory element, a plurality of input terminals and at least one output terminal, at least one second decode circuit input terminal coupled to receive a first address signal, at least another second decode circuit input terminal coupled to receive the bank address signal, the second decode circuit output terminal coupled to the at least one input terminal of the first decode circuit, the second decode circuit arranged to store the first address signal in the memory element in response to the bank address signal.

17. A memory circuit as in claim 16, further comprising a control circuit coupled to receive a clock signal, the memory circuit arranged to operate in synchronization with the clock signal.

18. A memory circuit as in claim 17, further comprising a third decode circuit having at least one input and one output terminal, the input terminal coupled to receive a respective a second address signal, the output terminal coupled to the at least one second decode circuit input terminal.

19. A memory circuit as in claim 18, wherein each of the first and second address signals comprises a logical combination of at least two address bits.

20. A memory circuit as in claim 17, further comprising:
an address register, the address register coupled to receive an external address signal, the address register producing an internal address signal in synchronization with the system clock signal;
an address counter, the address counter arranged for producing a counter address signal in synchronization with the system clock signal; and
a multiplex circuit, the multiplex circuit coupled to receive the internal address signal and the counter address signal, the multiplex circuit selectively producing the first address signal in response to a control signal.

* * * * *

UNITED STATES PATENT AND TRADEMARK OFFICE
CERTIFICATE OF CORRECTION

PATENT NO. : 6,088,293
DATED : July 11, 2000
INVENTOR(S) : Michael Duc Ho

It is certified that error appears in the above-identified patent and that said Letters Patent is hereby corrected as shown below:

<u>Title page,</u>
Item [60]: Under Related US Application Data, the following statement needs to be added:

-- Provisional Application No. 60/099,389, September 8, 1998 --.

Signed and Sealed this

Seventh Day of August, 2001

*Attest:*

*Attesting Officer*

NICHOLAS P. GODICI
*Acting Director of the United States Patent and Trademark Office*